(12) United States Patent
Huang et al.

(10) Patent No.: US 7,791,301 B2
(45) Date of Patent: Sep. 7, 2010

(54) APPARATUS AND METHOD FOR FAN AUTO-DETECTION

(75) Inventors: Shih-Feng Huang, Hsinchu (TW); Chia-Ching Lu, Hsinchu (TW); Ming-Che Hung, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 289 days.

(21) Appl. No.: 12/003,825

(22) Filed: Jan. 2, 2008

(65) Prior Publication Data

US 2009/0169188 A1 Jul. 2, 2009

(51) Int. Cl.
*G05B 5/00* (2006.01)

(52) U.S. Cl. .................. 318/473; 318/471; 388/934

(58) Field of Classification Search ........... 388/934, 388/909, 811, 815; 318/473, 471, 599, 671, 318/738, 503, 608
See application file for complete search history.

(56) References Cited

U.S. PATENT DOCUMENTS

| | | | |
|---|---|---|---|
| 7,199,542 B1 * | 4/2007 | Chen | 318/473 |
| 7,313,466 B2 * | 12/2007 | Chang | 700/300 |
| 2006/0108962 A1 | 5/2006 | Murray et al. | |
| 2006/0291160 A1 * | 12/2006 | Freeman et al. | 361/687 |
| 2007/0019383 A1 | 1/2007 | Chang | |
| 2008/0004755 A1 | 1/2008 | Dunstan et al. | |

OTHER PUBLICATIONS

Intel Corporation, 4-Wire Pulse Width Modulation (PWM) Controlled Fans Specification, Revision 1.3, Sep. 2005, pp. 1-25.
Winbond Electronics Corp., PCI to ISA Bridge W83628F/G W83629D/G, Revision 0.6, Jun. 2006, pp. 1-45.
Winbond Electronics Corp., W83627DHG Windbond LPC I/O, Version 1.4, Apr. 10, 2007, pp. 1-248.
Winbond Electronics Corp., W83793G/W83793AG Winbond H/W Monitor, Revision 1.1, Dec. 3, 2006, pp. 1-180.
Winbond Electronics Corp., W3627DHG Application Circuit (LPC I/O+HW) Specification, Jun. 27, 2006.

* cited by examiner

*Primary Examiner*—Karen Masih
(74) *Attorney, Agent, or Firm*—Finnegan, Henderson, Farabow, Garrett & Dunner, LLP

(57) ABSTRACT

An apparatus for detecting a type of fan and controlling the fan, the fan providing during operation a tachometer signal indicating a speed of the fan, the apparatus includes: a direct current (DC) generator for coupling to the fan and configured to provide a first voltage to the fan; a resistor for providing, while the DC generator provides the first voltage, a sensed voltage relating to the type of the fan, wherein the resistor is connected to a reference voltage and for coupling to a pulse-width modulation (PWM) control terminal of the fan; an input judgment component coupled to the resistor to receive the sensed voltage, the input judgment component being configured to determine whether the fan is a 4-wire PWM fan with an internal pull-up resistor based on the sensed voltage and to provide a judgment signal indicating the determination; a PWM generator coupled to the input judgment component to receive the judgment signal, the PWM generator being configured to provide to the fan a PWM control signal to control the fan if the judgment signal indicates that the fan is the 4-wire PWM fan with an internal pull-up resistor; and a tachometer coupled to the DC generator and the PWM generator, the tachometer being configured to receive the tachometer signal to detect a change in the speed of the fan.

25 Claims, 6 Drawing Sheets

US 7,791,301 B2

APPARATUS AND METHOD FOR FAN AUTO-DETECTION

FIELD OF THE INVENTION

This invention pertains in general to an apparatus and method for heat dissipation and, more particularly, to an apparatus and method for fan auto-detection and control.

BACKGROUND OF THE INVENTION

Due to recent technology developments, processors, memory cards, and other components in electronic devices, e.g., computers, have increased in working frequency and power consumption. As a result, the amount of heat produced by these components as a side effect of normal operation may have also increased. To prevent possible overheating of such components, which may lead to malfunction and damage of the electronic devices, temperatures of those components usually need to be monitored, and kept within a reasonable range by dissipation of heat generated by those components, i.e., the components to be cooled. Dissipation of heat generated by those components may also improve their reliability.

Heat dissipation techniques for electronic devices may include using heat sinks and fans for air cooling. For example, heat sinks may be used to transfer thermal energy from the component(s) to be cooled to the surrounding cooler air. A heat sink may comprise a metal structure with flat surfaces to ensure good thermal contact with the component(s) to be cooled. However, heat sinks may be insufficient for some electronic devices.

As an alternative, a fan may be introduced into the electronic device to generate airflow around the component(s) to be cooled. A faster speed of the fan may lead to better cooling efficiency, because the fan may move heated air away from the component(s) to be cooled and draw cooler air over them more quickly. The fan may also be used in combination with heat sinks to further improve cooling efficiency. There are different types of fans and ways of controlling them. For example, 3-wire direct current (DC) fans and 4-wire pulse-width modulation (PWM) fans are among popular fans that may be used to dissipate heat from components in electronic devices such as computers. A 4-wire PWM fan may or may not include an internal pull-up resistor. The 4-wire PWM fan with an internal pull-up resistor complies with the Intel® 4-wire PWM fan specification.

FIG. 1 illustrates an input/output interface 102 for a conventional 3-wire DC fan 104. The input/output interface 102 has a ground terminal 106, a voltage control terminal 108, and a tachometer terminal 110. The voltage control terminal 108 is an input terminal, and the tachometer terminal 110 is an output terminal providing a tachometer signal that has a frequency proportional to the operating speed of the 3-wire DC fan 104. The speed of the 3-wire DC fan 104 may be described by a parameter "revolutions per minute" (RPM). Therefore, the tachometer signal indicates the speed or RPM of the 3-wire DC fan 104 and may be used for closed-loop speed control of the 3-wire DC fan 104. By changing a voltage applied to the voltage control terminal 108 of the 3-wire DC fan 104, the speed of the 3-wire DC fan 104 may be controlled. For example, if the 3-wire DC fan 104 is adapted to have a maximum input voltage 12 V, the voltage applied to the voltage control terminal 108 may vary from 4 V to 12 V during fan operation. The operating speed of the 3-wire DC fan 104 would generally vary in a direct relationship to the magnitude of the voltage applied to the voltage control terminal 108.

FIG. 2 illustrates an input/output interface 202 for a conventional 4-wire PWM fan 204. The 4-wire PWM fan 204 can be either a 4-wire PWM fan with an internal pull-up resistor or a 4-wire PWM fan without an internal pull-up resistor. The 4-wire PWM fan 204 has a ground terminal 206, a power terminal 208, a tachometer terminal 210, and a PWM control terminal 212. The power terminal 208 and the PWM control terminal 212 are usually input terminals, and the tachometer terminal 210 is an output terminal providing a tachometer signal that has a frequency proportional to the operating speed of the 4-wire PWM fan 204. Therefore the tachometer signal indicates the speed or RPM of the 4-wire PWM fan 204 and may be used for closed-loop speed control of the 4-wire PWM fan 204.

The speed of the 4-wire PWM fan 204 may be controlled by changing a duty cycle value of a signal applied to the PWM control terminal 212, i.e., the PWM control signal. For example, a PWM control signal with a 50% duty cycle value may control the 4-wire PWM fan 204 to operate at a speed that is 50% of the fan's full speed. Similarly, a PWM control signal with an 80% duty cycle value may control the 4-wire PWM fan 204 to operate at a speed that is 80% of the fan's full speed. In other words, as the duty cycle value of the PWM control signal is increased or decreased, the operating speed of the 4-wire PWM fan 204 correspondingly increases or decreases.

Typically, an electronic device is designed to support one type of fan. As a result, a user of the electronic device may need to select a specific fan for the electronic device, which may cause inconvenience to a user that does not know the fan specification of the electronic device. For example, when a computer user needs to select a fan for the computer, the user may first need to check the motherboard of that computer to determine which type of fan the motherboard supports.

SUMMARY OF THE INVENTION

In accordance with the invention, there is provided an apparatus for detecting a type of fan and controlling the fan, the fan providing during operation a tachometer signal indicating a speed of the fan, the apparatus comprising: a direct current (DC) generator for coupling to the fan and configured to provide a first voltage to the fan; a resistor for providing, while the DC generator provides the first voltage, a sensed voltage relating to the type of the fan, wherein the resistor is connected to a reference voltage and for coupling to a pulse-width modulation (PWM) control terminal of the fan; an input judgment component coupled to the resistor to receive the sensed voltage, the input judgment component being configured to determine whether the fan is a 4-wire PWM fan with an internal pull-up resistor based on the sensed voltage and to provide a judgment signal indicating the determination; a PWM generator coupled to the input judgment component to receive the judgment signal, the PWM generator being configured to provide to the fan a PWM control signal to control the fan if the judgment signal indicates that the fan is the 4-wire PWM fan with an internal pull-up resistor; and a tachometer coupled to the DC generator and the PWM generator, the tachometer being configured to receive the tachometer signal to detect a change in the speed of the fan.

Also in accordance with the invention, there is provided a circuit for detecting a type of fan and controlling the fan, the fan providing during operation a tachometer signal indicating a speed of the fan, the circuit comprising: an integrated circuit provided on a substrate, the integrated circuit including: a direct current (DC) generator for coupling to the fan and configured to provide a first voltage to the fan; a resistor for providing, while the DC generator provides the first voltage, a sensed voltage relating to the type of the fan, wherein the resistor is connected to a reference voltage and for coupling to a pulse-width modulation (PWM) control terminal of the fan; an input judgment component coupled to the resistor to receive the sensed voltage, the input judgment component being configured to determine whether the fan is a 4-wire PWM fan with an internal pull-up resistor based on the sensed voltage and to provide a judgment signal indicating the determination; a PWM generator coupled to the input judgment component to receive the judgment signal, the PWM generator being configured to provide to the fan a PWM control signal to control the fan if the judgment signal indicates that the fan is the 4-wire PWM fan with an internal pull-up resistor; and a tachometer coupled to the DC generator and the PWM generator, the tachometer being configured to receive the tachometer signal to detect a change in the speed of the fan.

Further in accordance with the invention, there is provided a method for detecting a type of a fan, the fan providing during operation a tachometer signal indicating a speed of the fan, the method comprising: providing a first direct current (DC) voltage to the fan; and sensing a voltage relating to the type of the fan, while the fan receives the first DC voltage, to determine whether the fan is a 4-wire pulse-width modulation (PWM) type fan with an internal pull-up resistor.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this application, illustrate embodiments of the invention and, together with the description, serve to explain the principles of the invention.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the claimed invention. Instead, they are merely examples of systems and methods consistent with aspects related to the invention as recited in the appended claims.

In embodiments consistent with the present invention, there is provided an apparatus for automatic detection of a type of fan and appropriately control the fan according to the fan type. Such automatic detection is also referred to herein as "auto-detect" or "auto-detection." The apparatus may be incorporated into an electronic device, e.g., a computer, and auto-detect different types of fans, e.g., a 3-wire DC fan or a 4-wire PWM fan, that may be used to dissipate heat generated by components of the electronic device. The apparatus provides an interface for the electronic device to connect to the different types of fans, and therefore may reduce development time and cost of the electronic device, and facilitate ease of use by the user of the electronic device.

Figure 1:
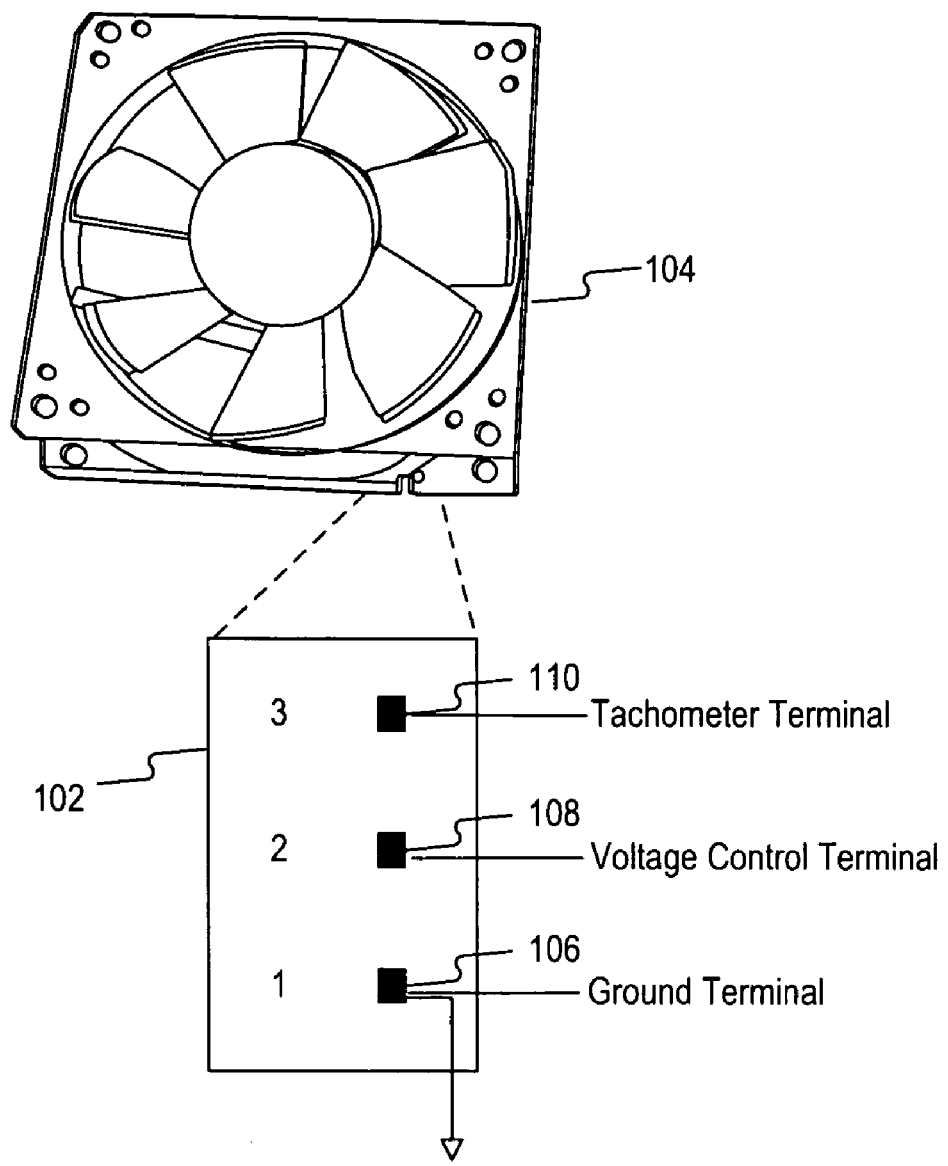
FIG. 1 illustrates an input/output interface of a conventional 3-wire DC fan.
Figure 2:
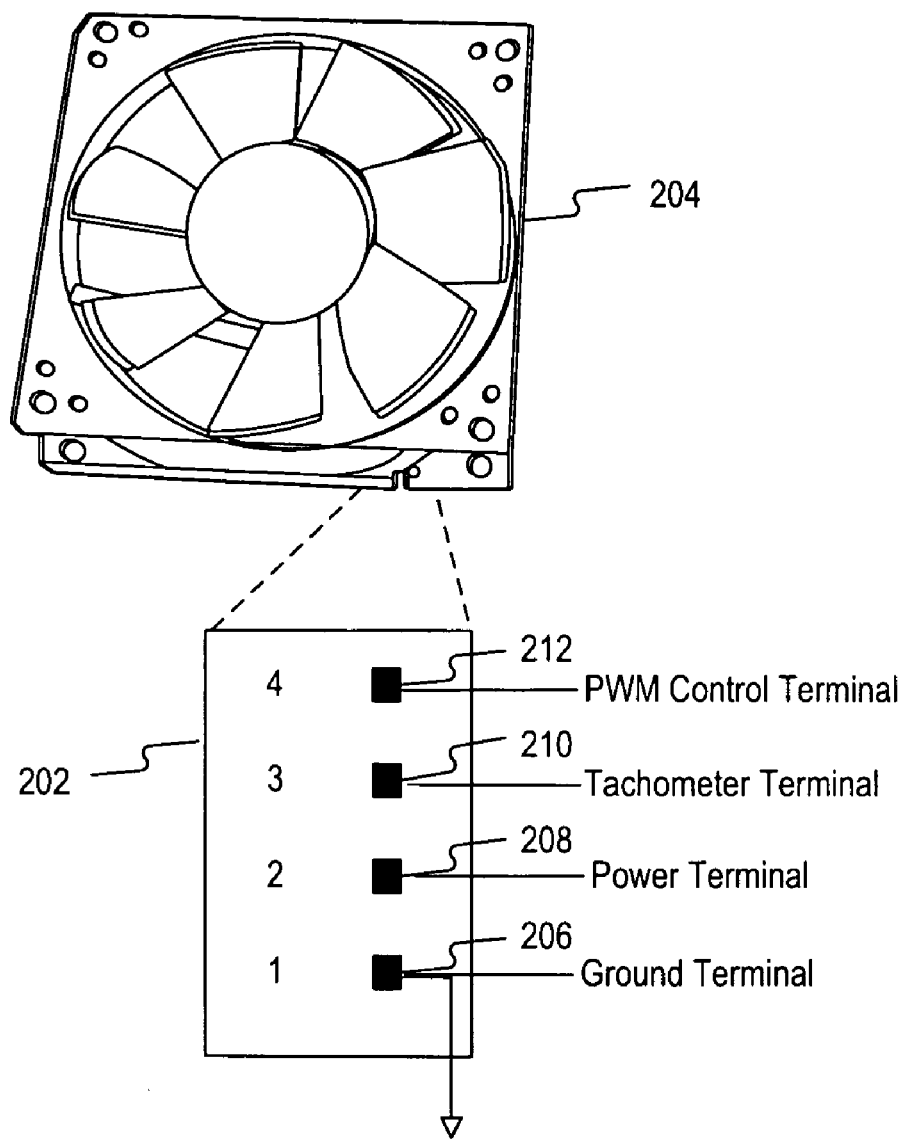
FIG. 2 illustrates an input/output interface of a conventional 4-wire PWM fan.
Figure 3A:
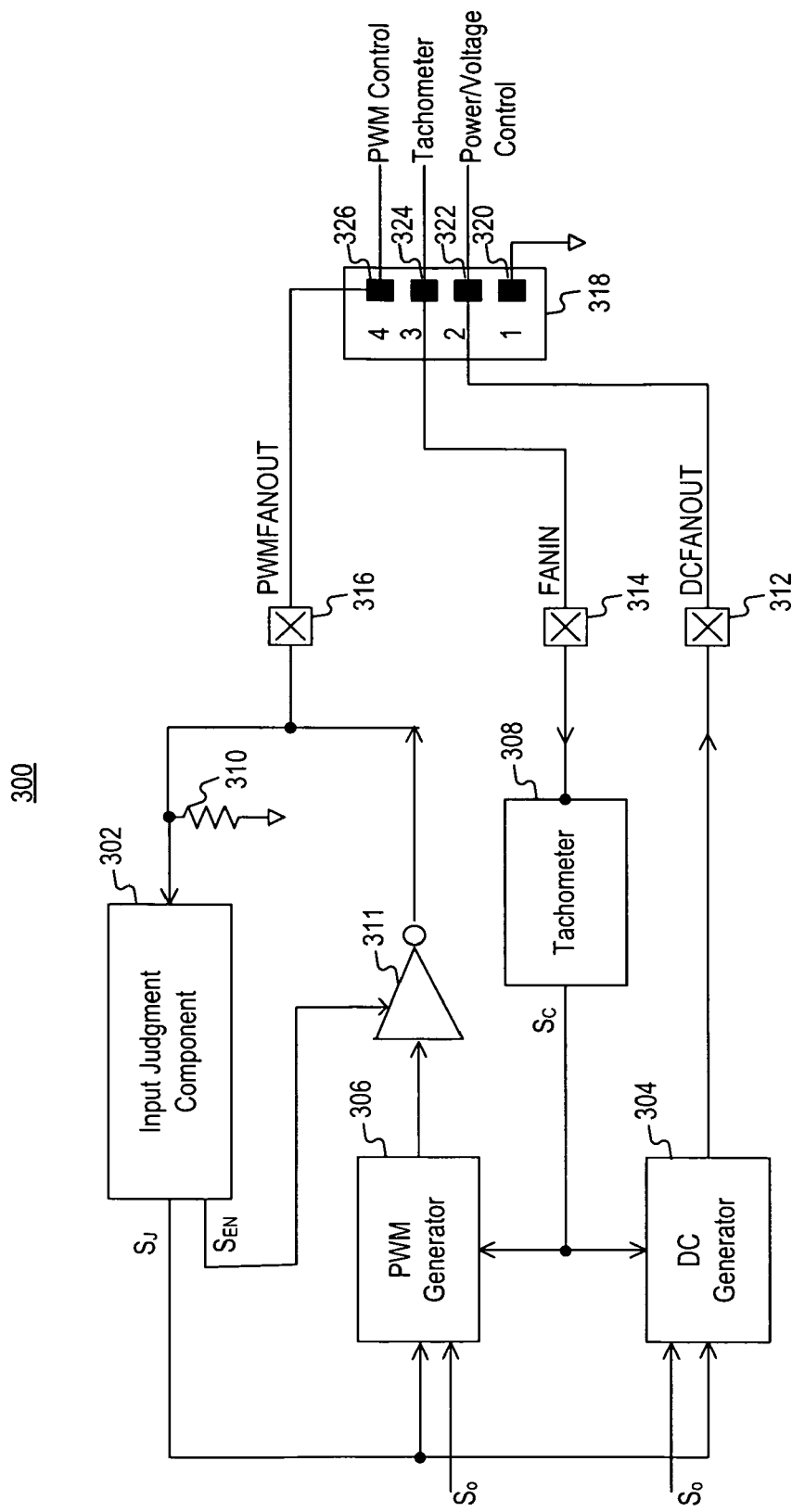
FIG. 3A illustrates an apparatus for fan auto-detection and control, according to an exemplary embodiment.

FIG. 3A illustrates an apparatus 300 for fan auto-detection and control, according to an exemplary embodiment. For example, the apparatus 300 may be connected to a fan, not shown, which is used to dissipate heat generated by a component of an electronic device $D_0$, i.e., the component to be cooled, such as a computer processor. The fan may be any one of different types, such as a 3-wire DC fan, a 4-wire PWM fan with an internal pull-up resistor, or a 4-wire PWM fan without an internal pull-up resistor. The apparatus 300 may auto-detect the type of the fan, and control the fan at different speeds based on a temperature of the component to be cooled.

The apparatus 300 includes an input judgment component 302, a DC generator 304, a PWM generator 306, and a tachometer 308. The apparatus 300 further includes a resistor 310 connected to a reference voltage signal to provide a sensed voltage relating to the type of the fan, and an output enable component 311 coupled to the PWM generator 306. During fan auto-detection, the input judgment component 302 is configured to provide an input judgment signal $S_J$ in response to the sensed voltage inputted thereto. The DC generator 304 is adapted to output a DC voltage for operating the fan. The PWM generator 306 is adapted to output a PWM control signal with a particular duty cycle value.

The apparatus 300 also includes three terminals: a first terminal DCFANOUT 312 coupled to the DC generator 304 and operating as an output terminal; a second terminal FANIN 314 coupled to the tachometer 308 and operating as an input terminal; and a third terminal PWMFANOUT 316 coupled to the input judgment component 302, and coupled to the PWM generator 306 via the output enable component 311. The output enable component 311 is configured to enable the PWM control signal provided by the PWM generator 306 to be outputted at the terminal PWMFANOUT 316 based on an output enable signal $S_{EN}$ received from the input judgment component 302. The terminal PWMFANOUT 316 operates as an input/output terminal. For example, during system power-up, the terminal PWMFANOUT 316 is coupled to input the sensed voltage relating to the type of the fan to the input judgment component 302. Also for example, based on an output enable signal $S_{EN}$ with a high voltage level, the terminal PWMFANOUT 316 is coupled to output a PWM control signal provided by the PWM generator 306 via the output enable component 311.

Further, the apparatus 300 includes a connector 318 to provide an input/output interface to the fan. The connector 318 may have four pins 320, 322, 324, and 326. The pin 320 is for coupling to ground or the reference voltage signal. The pins 322, 324, and 326 are coupled to the terminal DCFANOUT 312, the terminal FANIN 314, and the terminal PWMFANOUT 316, respectively. For example, via the pin 322 of the connector 318, the terminal DCFANOUT 312 may be connected to the voltage control terminal of the fan if the fan is a 3-wire DC fan, or connected to the power terminal of the fan if the fan is a 4-wire PWM fan. Further, for example, via the pin 324 of the connector 318, the terminal FANIN 314 may be connected to the tachometer terminal of the fan. Also, for example, via the pin 326 of the connector 318, the terminal PWMFANOUT 316 may be connected to the PWM control terminal of the fan if the fan is a 4-wire PWM fan, or be floating if the fan is a 3-wire DC fan. Therefore the connector 318 may provide an input/output interface for the apparatus 300 to connect to different types of fans.

The input judgment component 302 may determine whether the fan connected to the apparatus 300 is a 4-wire PWM fan with an internal pull-up resistor based on the sensed voltage inputted to the judgment component 302, but may not determine whether the fan is a 3-wire DC fan or a 4-wire PWM fan without an internal pull-up resistor. For example, the input judgment component 302 may output a high level signal as the input judgment signal $S_J$ if it determines the fan connected to the apparatus 300 is a 4-wire PWM fan with an internal pull-up resistor. Otherwise, the input judgment component 302 may output a low level signal as the input judgment signal $S_J$.

The DC generator 304 and the PWM generator 306 are each coupled to the input judgment component 302 to receive the input judgment signal $S_J$. The tachometer 308 is coupled to the DC generator 304 and the PWM generator 306 to provide a comparison signal $S_C$. As explained above, a tachometer signal outputted by the fan being controlled and received on the pin 324 has a frequency proportional to the operating speed of that fan. The tachometer 308 is adapted to determine whether the fan is a 3-wire DC fan or a 4-wire PWM fan without an internal pull-up resistor, based on two values of the tachometer signal sequentially received from the fan connected to the apparatus 300, and output the comparison signal $S_C$ to indicate the result of the determination. For example, the tachometer 308 may output a high level signal as the comparison signal $S_C$ if it further determines the fan connected to the apparatus 300 is a 4-wire PWM fan without an internal pull-up resistor. Otherwise the tachometer 308 may output a low level signal as the comparison signal $S_C$, indicating the fan is a 3-wire DC fan.

Figure 3B:
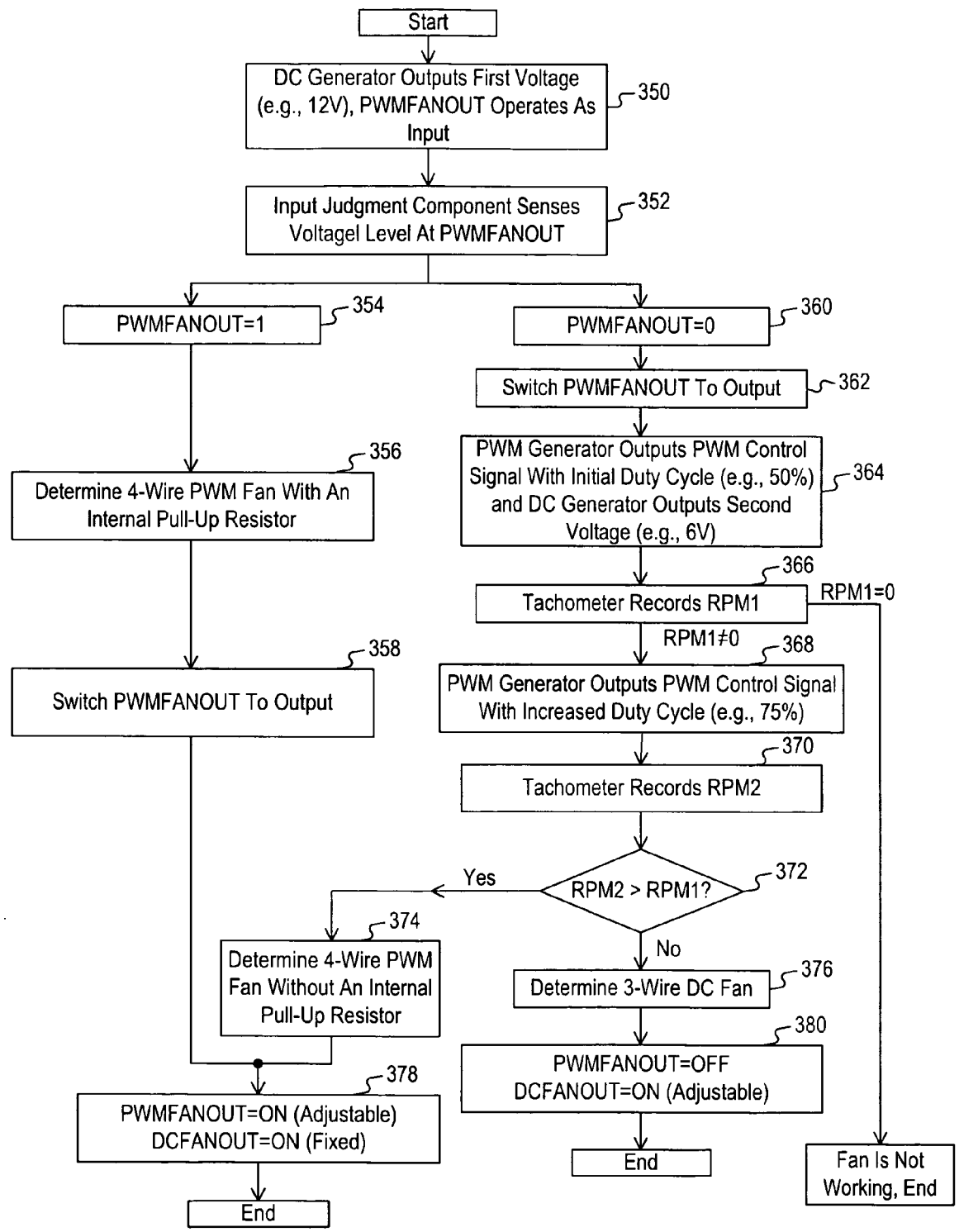
FIG. 3B illustrates a flowchart of a method for an apparatus to perform fan auto-detection and control, according to an exemplary embodiment.

FIG. 3B illustrates a flowchart of a method for the apparatus 300 to perform fan auto-detection and control, according to an exemplary embodiment. Referring to FIGS. 3A and 3B, during system power-up, the DC generator 304 first outputs a first or initial voltage to provide power to the fan connected to the apparatus 300 via the terminal DCFANOUT 312 and the pin 322, and the terminal PWMFANOUT 316 operates as an input terminal (FIG. 3B, step 350). For example, the first voltage may be a normal operating voltage of a 4-wire PWM fan, which may be a fixed value of 12 V and close to a maximum input voltage of a 3-wire DC fan. Also, for example, the input judgment component 302 may send the output enable signal $S_{EN}$ with a low voltage level to the output enable component 311. As a result, no PWM control signal provided by the PWM generator 306 may pass through the output enable component 311, and the terminal PWMFANOUT 316 operates as an input terminal.

The fan commences operation upon receiving the power from the DC generator 304. The input judgment component 302 may then receive the sensed voltage inputted thereto on the terminal PWMFANOUT 316 (step 352). For example, if the fan is a 4-wire PWM fan with an internal pull-up resistor, the resistor 310, the terminal PWMFANOUT 316, and the internal pull-up resistor of the 4-wire PWM fan will form a current path, and a resulting current flow will cause a voltage drop across the resistor 310 that is sensed as a high level voltage on the terminal PWMFANOUT 316. Otherwise, a low level voltage, corresponding to the reference voltage signal, will be sensed on the terminal PWMFANOUT 316.

If the input judgment component 302 senses an inputted high level voltage, i.e., PWMFANOUT=1, (step 354), the input judgment component 302 may determine the fan is a 4-wire PWM fan with an internal pull-up resistor (step 356), and output a judgment signal $S_J$, e.g., a high level signal, to the DC generator 304 and the PWM generator 306, indicating the detection of the 4-wire PWM fan with an internal pull-up resistor. The terminal PWMFANOUT 316 is switched to operate as an output terminal (step 358). For example, the input judgment component 302 may send the output enable signal $S_{EN}$ with a high voltage level to the output enable component 311. As a result, the PWM control signal provided by the PWM generator 306 may pass through the output enable component 311 and be outputted at the terminal PWMFANOUT 316, such that the terminal PWMFANOUT 316 operates as an output terminal. The detected 4-wire PWM fan with an internal pull-up resistor may then be controlled by the apparatus 300 to operate at different speeds.

Alternatively, if the input judgment component 302 senses an inputted low level voltage, i.e., PWMFANOUT=0, (step 360), the input judgment component 302 may output a different judgment signal $S_J$, e.g., a low level signal, to the DC generator 304 and the PWM generator 306, indicating that further fan detection is needed. The terminal PWMFANOUT 316 is also switched to operate as an output terminal as explained above (step 362).

If the DC generator 304 and the PWM generator 306 receive the judgment signal $S_J$ from the input judgment component 302 indicating that further fan detection is needed, the DC generator 304 may output a second voltage that is lower than the first voltage but high enough to cause continued operation of the fan, and the PWM generator 306 may output a PWM control signal with an initial duty cycle (step 364). In one embodiment, the second voltage outputted by the DC generator 304 may be 50% of a maximum input voltage of a 3-wire DC fan, e.g., 6V, and the initial duty cycle of the PWM control signal outputted by the PWM generator 306 may be 50%. Typically, 50% of a maximum input voltage is a safe operation point for a 3-wire DC fan and a 50% duty cycle is a safe operation point for a 4-wire PWM fan without an internal pull-up resistor.

The fan connected to the apparatus 300 receives the second voltage from the DC generator 304 via the DCFANOUT terminal 312 and the pin 322. If the fan is a 4-wire PWM fan, the fan also receives the PWM control signal with the initial duty cycle from the PWM generator 306 via the PWMFANOUT terminal 316 and the pin 326. In accordance with the resulting operation of the fan, the fan outputs a first tachometer signal indicating a first speed RPM1 of the fan, based on the second voltage and, possibly, the PWM control signal with the initial duty cycle. The tachometer 308 receives the first tachometer signal via the FANIN terminal 314 and the pin 324, and records RPM1 (step 366). If RPM1 is zero, the tachometer 308 may determine that the fan is not working. In one embodiment, the apparatus 300 may notify the electronic device $D_0$ that the fan is not working, and the user of the electronic device $D_0$ may receive a fan failure alert.

If RPM1 is not zero, the tachometer 308 sends a first value of the comparison signal $S_C$ to the DC generator 304 and the PWM generator 306. Upon receiving the first value of the comparison signal $S_C$ from the tachometer 308, the DC generator 304 continues to output the second voltage, and the PWM generator 306 outputs a PWM control signal with an increased duty cycle (step 368). In one embodiment, the increased duty cycle of the PWM control signal output by the PWM generator 306 may be 75%.

The fan connected to the apparatus 300 may receive the PWM control signal with the increased duty cycle via the PWMFANOUT terminal 316 and the pin 326, if the fan is a 4-wire PWM fan. In accordance with the resulting operation of the fan, the fan outputs a second tachometer signal indicating a second speed RPM2 of the fan, based on the second voltage and, possibly, the PWM control signal with the increased duty cycle. The tachometer 308 receives the second tachometer signal via the FANIN terminal 314 and records RPM2 as an updated speed of the fan (step 370).

As noted above, the speed of a 3-wire DC fan may be controlled by changing the input voltage of the 3-wire DC fan, while the speed of a 4-wire PWM fan may be controlled by changing the duty cycle of the PWM control signal applied to the 4-wire PWM fan. Therefore, by comparing RPM1 and RPM2 (step 372), the tachometer 308 can determine whether the fan is a 3-wire DC fan or a 4-wire PWM fan without an internal pull-up resistor. For example, if RPM2 is larger than RPM1, which means the speed of the fan has increased, the tachometer 308 determines that the fan is a 4-wire PWM fan without an internal pull-up resistor (step 374). If RPM2 is not larger than RPM1, which means the speed of the fan has not increased, the tachometer 308 determines that the fan is a 3-wire DC fan (step 376).

Once the tachometer 308 determines whether the fan is a 3-wire DC fan or a 4-wire PWM fan without an internal pull-up resistor, the tachometer 308 sends a second value of the comparison signal $S_C$ to the DC generator 304 and the PWM generator 306. For example, the tachometer 308 may generate the second value of the comparison signal $S_C$ to have a high level to indicate the detection of the 4-wire PWM fan without an internal pull-up resistor, or to have a low level to indicate the detection of the 3-wire DC fan.

After detection of the type of the fan connected to the apparatus 300, the DC generator 304 and the PWM generator 306 may be set to a corresponding working mode. For example, if the fan is a 4-wire PWM fan with or without an internal pull-up resistor, the DC generator 304 may output a fixed voltage, e.g., 12 V, or the normal working voltage of the 4-wire PWM fan, to the 4-wire PWM fan via the DCFANOUT terminal 312 and the pin 322, and the PWM generator 306 may output a PWM control signal with an adjustable duty cycle to control the speed of the fan via the PWMFANOUT terminal 316 and the pin 326 (step 378). Alternatively, if the fan is a 3-wire DC fan, the DC generator 304 may output an adjustable voltage to control the speed of the fan via the DCFANOUT terminal 312 and the pin 322, and the PWMFANOUT terminal 316 may be turned off (step 380). For example, when it is turned off, the PWMFANOUT terminal 316 is floating or kept at a high level voltage.

In one embodiment, the DC generator 304 and the PWM generator 306 may also receive a control signal $S_O$ from a control circuit (not shown in FIG. 3A), in addition to the judgment signal $S_J$ received from the input judgment component 302 and the comparison signal $S_C$ received from the tachometer 308. The control signal $S_O$ may be generated based on the temperature of the component to be cooled and include information indicating whether the speed of the fan connected to the apparatus 300 needs to be decreased or increased. Based on the control signal $S_O$, the apparatus 300 may control the speed of the fan after the apparatus 300 detects the type of the fan.

For example, if the control signal $S_O$ includes information indicating the need to increase the speed of the fan and if the apparatus 300 has detected the fan as a 3-wire DC fan, the DC generator 304 may output an increased voltage to increase the speed of the 3-wire DC fan. Also for example, if the control signal $S_O$ includes information indicating the need to increase the speed of the fan and if the apparatus 300 has detected the fan as a 4-wire PWM fan, the PWM generator 306 may output a PWM control signal with an increased duty cycle to increase the speed of the 4-wire PWM fan.

Figure 4A:
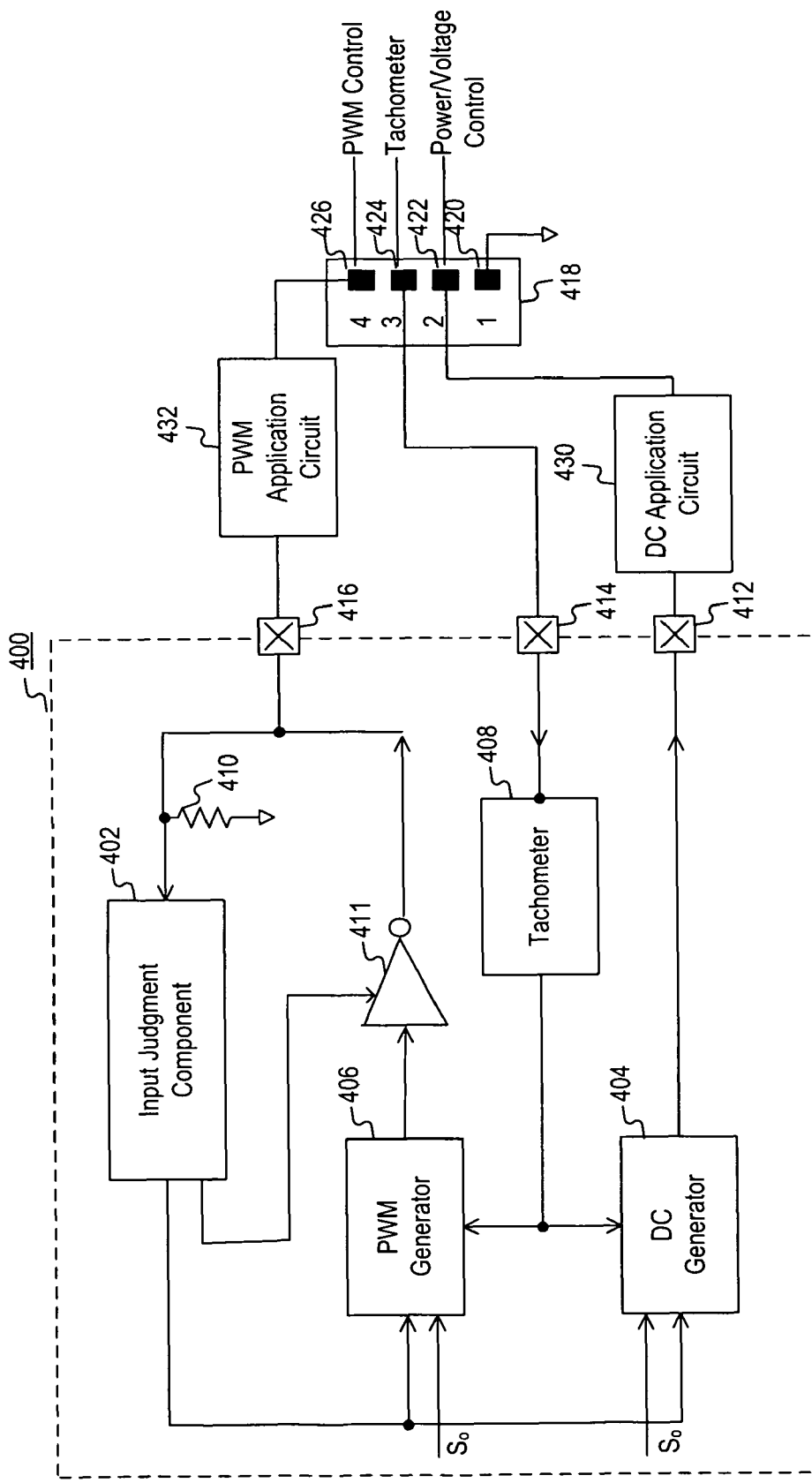
FIGS. 4A and 4B illustrate an integrated circuit for fan auto-detection and control, according to an exemplary embodiment.
Figure 4B:
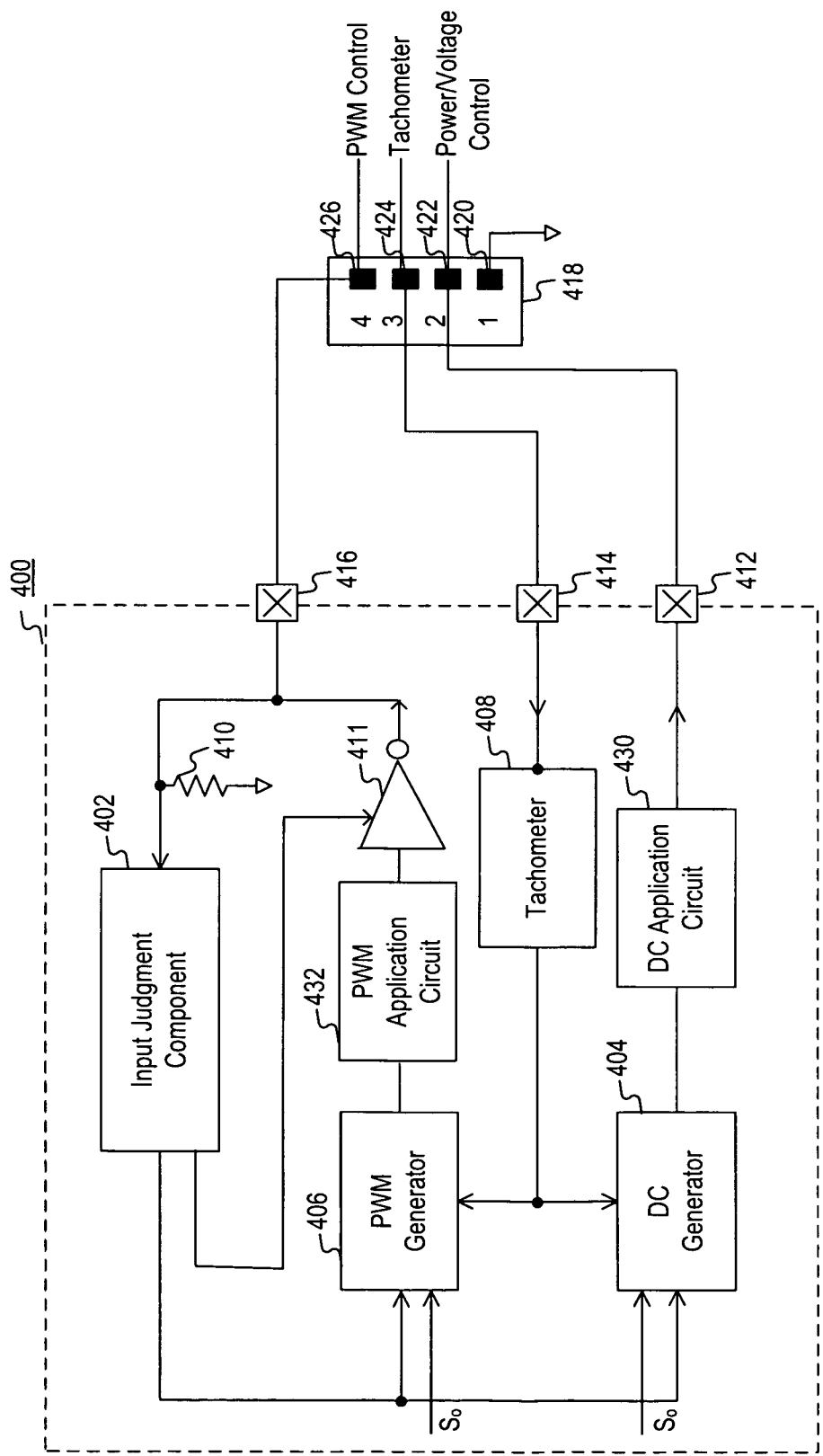

FIGS. 4A and 4B illustrate a integrated circuit 400 for fan auto-detection and control, according to an exemplary embodiment. For example, the circuit 400 may be an integrated circuit on a motherboard of a computer and connected to a fan which dissipates heat generated by a component of the computer, i.e., the component to be cooled, such as the processor of the computer. The fan may be any one of several different types, such as a 3-wire DC fan, a 4-wire PWM fan with an internal pull-up resistor, or a 4-wire PWM fan without an internal pull-up resistor. The circuit 400 may auto-detect the type of the fan, and control a speed of the fan based on a temperature of the component to be cooled.

The integrated circuit 400 may include an input judgment component 402, a DC generator 404, a PWM generator 406, a tachometer 408, a resistor 410, and an output enable component 411, which are provided on a substrate and operate as previously discussed with reference to the input judgment component 302, the DC generator 304, the PWM generator 306, the tachometer 308, the resistor 310, and the output enable component 311 in FIG. 3A, respectively. The input judgment component 402 may include digital circuitry, analog circuitry, or both; the DC generator 404 may include analog circuitry; the PWM generator 406 may include digital circuitry, or both digital and analog circuitry; and the tachometer 408 may include digital circuitry. The integrated circuit 400 may further include a first terminal DCFANOUT 412, a second terminal FANIN 414, and a third terminal PWMFANOUT 416, which also operate as previously discussed with reference to the terminal DCFANOUT 312, the terminal FANIN 314, and the terminal PWMFANOUT 316 in FIG. 3A, respectively.

In embodiments consistent with the present invention, a connector 418 may be provided external to the integrated circuit 400, to provide an input/output interface to the fan connected to the integrated circuit 400. The connector 418 may have four pins 420, 422, 424, and 426. The pin 420 is for coupling to ground or a reference voltage signal. The pins 422, 424, and 426 are coupled to the terminal DCFANOUT 412, the terminal FANIN 414, and the terminal PWMFANOUT 416, respectively.

Due to the IC manufacturing process, the DC generator 404 and the PWM generator 406 may not output a voltage high enough or a signal large enough to drive the fan connected to the integrated circuit 400. For example, the DC generator 404 may output a voltage in a range of 3-5 V, while the fan may have a maximum input voltage 12 V. Therefore a DC application circuit 430 and a PWM application circuit 432 may be provided external to the integrated circuit 400 to amplify signals outputted by the DC generator 404 and the PWM generator 406, respectively. Alternatively, the DC application circuit 430 and the PWM application circuit 432 may be provided on the same substrate of the integrated circuit 400 with the input judgment component 402, the DC generator 404, the PWM generator 406, and the tachometer 408.

In one embodiment, as shown in FIG. 4A, the terminal DCFANOUT 412 is coupled to the pin 422 of the connecter 418 via the DC application circuit 430. The terminal PWMFANOUT 416 is coupled to the pin 426 of the connecter 418 via the PWM application circuit 432. The DC application circuit 430 is configured to amplify a DC voltage outputted by the DC generator 404, and the PWM application circuit 432 is configured to amplify a PWM control signal outputted by the PWM generator 406.

In another embodiment shown in FIG. 4B, the DC application circuit 430 and the PWM application circuit 432 may be provided on the same substrate of the integrated circuit 400 with the input judgment component 402, the DC generator 404, the PWM generator 406, and the tachometer 408. The DC application circuit 430 is coupled between the DC generator 404 and the DCFANOUT terminal 412 to amplify the DC voltage outputted by the DC generator 404, and the PWM application circuit 432 is coupled between the PWM generator 406 and the PWMFANOUT terminal 416 to amplify the PWM control signal outputted by the PWM generator 406.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. An apparatus for detecting a type of fan and controlling the fan, the fan providing during operation a tachometer signal indicating a speed of the fan, the apparatus comprising:
    a direct current (DC) generator for coupling to the fan and configured to provide a first voltage to the fan;
    a resistor for providing, while the DC generator provides the first voltage, a sensed voltage relating to the type of the fan, wherein the resistor is connected to a reference voltage and for coupling to a pulse-width modulation (PWM) control terminal of the fan;
    an input judgment component coupled to the resistor to receive the sensed voltage, the input judgment component being configured to determine whether the fan is a 4-wire PWM fan with an internal pull-up resistor based on the sensed voltage and to provide a judgment signal indicating the determination;
    a PWM generator coupled to the input judgment component to receive the judgment signal, the PWM generator being configured to provide to the fan a PWM control signal to control the fan if the judgment signal indicates that the fan is the 4-wire PWM fan with an internal pull-up resistor; and
    a tachometer coupled to the DC generator and the PWM generator, the tachometer being configured to receive the tachometer signal to detect a change in the speed of the fan.

2. The apparatus of claim 1, wherein:
    the PWM generator is configured to sequentially provide to the fan the PWM control signal having a first duty cycle value and then a second duty cycle value if the judgment signal indicates that the fan is not the 4-wire PWM fan with an internal pull-up resistor;
    the DC generator is coupled to the input judgment component to receive the judgment signal and to provide a second voltage to the fan if the judgment signal indicates that the fan is not the 4-wire PWM fan with an internal pull-up resistor; and
    the tachometer is configured to receive the tachometer signal having first and second values respectively corresponding to the first and second duty cycle values of the PWM control signal, to determine based on the first and second values whether the fan is a 3-wire direct current (DC) fan or a 4-wire PWM fan without an internal pull-up resistor, and to provide a comparison signal indicating the determination to the DC generator and the PWM generator.

3. The apparatus of claim 2, wherein the DC generator is configured to further receive a control signal for controlling the speed of the fan by adjusting a DC voltage provided to the fan, if the fan is determined to be the 3-wire DC fan.

4. The apparatus of claim 2, wherein the PWM generator is configured to further receive a control signal for controlling the speed of the fan by adjusting a duty cycle value of the PWM control signal provided to the fan, if the fan is determined to be the 4-wire PWM fan with an internal pull-up resistor or the 4-wire PWM fan without an internal pull-up resistor.

5. The apparatus of claim 2, further comprising a DC application circuit, the DC application circuit being coupled to the DC generator to amplify the DC voltage.

6. The apparatus of claim 2, further comprising a PWM application circuit, the PWM application circuit being coupled to the PWM generator to amplify the PWM signal.

7. The apparatus of claim 2, wherein the tachometer is configured to compare the first and second values of the tachometer signal to generate the comparison signal, and to further receive the tachometer signal after detecting the type of the fan for detecting the speed of the fan.

8. The apparatus of claim 2, further comprising:
    a first terminal coupled to the DC generator and for coupling to the fan;
    a second terminal coupled to the tachometer to input the tachometer signal from the fan; and
    a third terminal coupled to the input judgment component and the PWM generator, the third terminal being configured to input the sensed voltage and to output the PWM control signal.

9. The apparatus of claim 8, further comprising an output enable component coupled between the PWM generator and the third terminal, wherein the output enable component is configured to enable the PWM control signal to be outputted at the third terminal based on an output enable signal received from the input judgment component.

10. The apparatus of claim 8, further comprising a connector for providing an interface between the apparatus and the fan, wherein
    the connector has four pins;
    a first one of the four pins is for coupling to the reference voltage; and
    second, third, and fourth ones of the four pins are coupled to the first, second, and third terminals, respectively.

11. A circuit for detecting a type of fan and controlling the fan, the fan providing during operation a tachometer signal indicating a speed of the fan, the circuit comprising:
    an integrated circuit provided on a substrate, the integrated circuit including:
        a direct current (DC) generator for coupling to the fan and configured to provide a first voltage to the fan;
        a resistor for providing, while the DC generator provides the first voltage, a sensed voltage relating to the type of the fan, wherein the resistor is connected to a reference voltage and for coupling to a pulse-width modulation (PWM) control terminal of the fan;
        an input judgment component coupled to the resistor to receive the sensed voltage, the input judgment component being configured to determine whether the fan is a 4-wire PWM fan with an internal pull-up resistor based on the sensed voltage and to provide a judgment signal indicating the determination;

a PWM generator coupled to the input judgment component to receive the judgment signal, the PWM generator being configured to provide to the fan a PWM control signal to control the fan if the judgment signal indicates that the fan is the 4-wire PWM fan with an internal pull-up resistor; and a tachometer coupled to the DC generator and the PWM generator, the tachometer being configured to receive the tachometer signal to detect a change in the speed of the fan.

12. The apparatus of claim 11, wherein:

the PWM generator is configured to sequentially provide to the fan the PWM control signal having a first duty cycle value and then a second duty cycle value if the judgment signal indicates that the fan is not the 4-wire PWM fan with an internal pull-up resistor;

the DC generator is coupled to the input judgment component to receive the judgment signal and to provide a second voltage to the fan if the judgment signal indicates that the fan is not the 4-wire PWM fan with an internal pull-up resistor; and the tachometer is configured to receive the tachometer signal having first and second values respectively corresponding to the first and second duty cycle values of the PWM control signal, to determine based on the first and second values whether the fan is a 3-wire direct current (DC) fan or a 4-wire PWM fan without an internal pull-up resistor, and to provide a comparison signal indicating the determination to the DC generator and the PWM generator.

13. The circuit of claim 12, wherein the DC generator is configured to further receive a control signal for controlling the speed of the fan by adjusting a DC voltage provided to the fan, if the fan is determined to be the 3-wire DC fan.

14. The circuit of claim 12, wherein the PWM generator is configured to further receive a control signal for controlling the speed of the fan by adjusting a duty cycle value of the PWM control signal provided to the fan, if the fan is determined to be the 4-wire PWM fan with an internal pull-up resistor or the 4-wire PWM fan without an internal pull-up resistor.

15. The circuit of claim 12, further comprising a DC application circuit provided external to the integrated circuit, the DC application circuit being coupled to the DC generator to amplify the DC voltage.

16. The circuit of claim 12, further comprising a PWM application circuit provided external to the integrated circuit, the PWM application circuit being coupled to the PWM generator to amplify the PWM signal.

17. The circuit of claim 12, further comprising a DC application circuit provided on the same substrate of the integrated circuit, the DC application circuit being coupled to the DC generator to amplify the DC voltage.

18. The circuit of claim 12, further comprising a PWM application circuit provided on the same substrate of the integrated circuit, the PWM application circuit being coupled to the PWM generator to amplify the PWM signal.

19. The circuit of claim 12, wherein the tachometer is configured to compare the first and second values of the tachometer signal to generate the comparison signal, and to further receive the tachometer signal after detecting the type of the fan for detecting the speed of the fan.

20. The circuit of claim 12, further comprising:

a first terminal coupled to the DC generator and for coupling to the fan voltage terminal;

a second terminal coupled to the tachometer to input the tachometer signal from the fan; and a third terminal coupled to the input judgment component and the PWM generator, the third terminal being configured to input the sensed voltage and to output the PWM control signal.

21. The circuit of claim 20, further comprising an output enable component coupled between the PWM generator and the third terminal, wherein the output enable component is configured to enable the PWM control signal to be outputted at the third terminal based on an output enable signal received from the input judgment component.

22. The circuit of claim 20, further comprising a connector for providing an interface between the circuit and the fan, wherein the connector has four pins;

a first one of the four pins is for coupling to the reference voltage; and second, third, and fourth ones of the four pins are coupled to the first, second, and third terminals, respectively.

23. A method for detecting a type of a fan, the fan providing during operation a tachometer signal indicating a speed of the fan, the method comprising:

providing a first direct current (DC) voltage to the fan; and sensing a voltage relating to the type of the fan, while the fan receives the first DC voltage, to determine whether the fan is a 4-wire pulse-width modulation (PWM) type fan with an internal pull-up resistor.

24. The method of claim 23, further comprising:

providing, if the fan is determined to not be the 4-wire PWM type fan with an internal pull-up resistor, to the fan a second DC voltage and a PWM control signal with a first duty cycle value;

recording, from the fan, a first value of the tachometer signal corresponding to the first duty cycle value;

providing to the fan the second DC voltage and the PWM control signal with a second duty cycle value;

recording, from the fan, a second value of the tachometer signal corresponding to the second duty cycle value; and comparing the first and second values of the tachometer signal to determine whether the fan is a 4-wire PWM type fan without an internal pull-up resistor or a 3-wire DC type fan.

25. The method of claim 24, wherein the second duty cycle value is larger than the first duty cycle value.

* * * * *